(12) United States Patent
Wataya

(10) Patent No.: US 8,410,567 B2
(45) Date of Patent: Apr. 2, 2013

(54) SOLID IMAGE-PICKUP DEVICE WITH FLEXIBLE CIRCUIT SUBSTRATE

(75) Inventor: Yukinobu Wataya, Kanagawa (JP)

(73) Assignee: Sony Corporation, Tokyo (JP)

( * ) Notice: Subject to any disclaimer, the term of this patent is extended or adjusted under 35 U.S.C. 154(b) by 121 days.

(21) Appl. No.: 11/714,878

(22) Filed: Mar. 5, 2007

(65) Prior Publication Data

US 2007/0158774 A1    Jul. 12, 2007

Related U.S. Application Data

(63) Continuation of application No. 11/303,297, filed on Dec. 16, 2005, now Pat. No. 7,187,051, which is a continuation of application No. 10/263,122, filed on Oct. 2, 2002, now Pat. No. 7,045,870.

(30) Foreign Application Priority Data

Oct. 4, 2001    (JP) .................... 2001-308512

(51) Int. Cl.
    *H01L 31/0203*    (2006.01)
(52) U.S. Cl. ............. 257/433; 257/432; 257/E33.058
(58) Field of Classification Search ............ 257/433, 257/432, 621, 680, E33.058
    See application file for complete search history.

(56) References Cited

U.S. PATENT DOCUMENTS

| | | | |
|---|---|---|---|
| 4,872,934 A * | 10/1989 | Kameda | 156/250 |
| 5,808,873 A * | 9/1998 | Celaya et al. | 361/760 |
| 6,013,948 A * | 1/2000 | Akram et al. | 257/698 |
| 6,020,629 A * | 2/2000 | Farnworth et al. | 257/686 |
| 6,054,755 A * | 4/2000 | Takamichi et al. | 257/667 |
| 6,225,651 B1 * | 5/2001 | Billon | 257/200 |
| 6,384,473 B1 * | 5/2002 | Peterson et al. | 257/680 |
| 6,703,689 B2 * | 3/2004 | Wada | 257/621 |

FOREIGN PATENT DOCUMENTS

| | | |
|---|---|---|
| JP | 04-370958 | 12/1992 |
| JP | HEI 04-370958 | 12/1992 |
| JP | 10-050969 | 2/1998 |
| JP | HEI 10-050969 | 2/1998 |
| JP | 2000-003785 | 1/2000 |
| JP | 2002-057271 | 2/2002 |
| JP | 2006-128713 | 5/2006 |
| JP | 2006-174492 | 6/2006 |

* cited by examiner

*Primary Examiner* — Kimberly Rizkallah
*Assistant Examiner* — Duy T Nguyen
(74) *Attorney, Agent, or Firm* — Rader, Fishman & Grauer PLLC

(57) ABSTRACT

An improved solid image-pickup device is so formed that its semiconductor device has on its surface an image-pickup area having a plurality of light sensors arranged thereon. A plurality of bonding pads are formed on the surface of the semiconductor device and arranged around the image-pickup area. A plurality of through holes are formed through the semiconductor substrate, extending from the lower surfaces of the bonding pads to the back surface of the semiconductor substrate and each of the through holes is filled with an electrically conductive material, thereby effecting an electric connection between the bonding pads and the copper wire of the flexible circuit substrate bonded to the back surface of the semiconductor substrate.

12 Claims, 5 Drawing Sheets

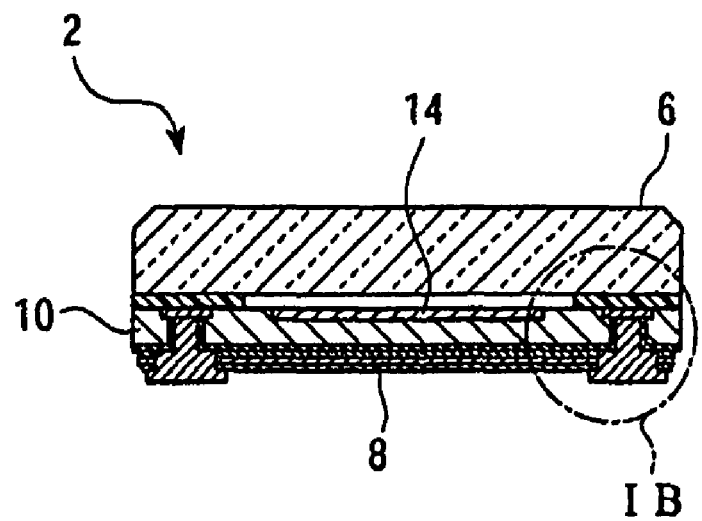
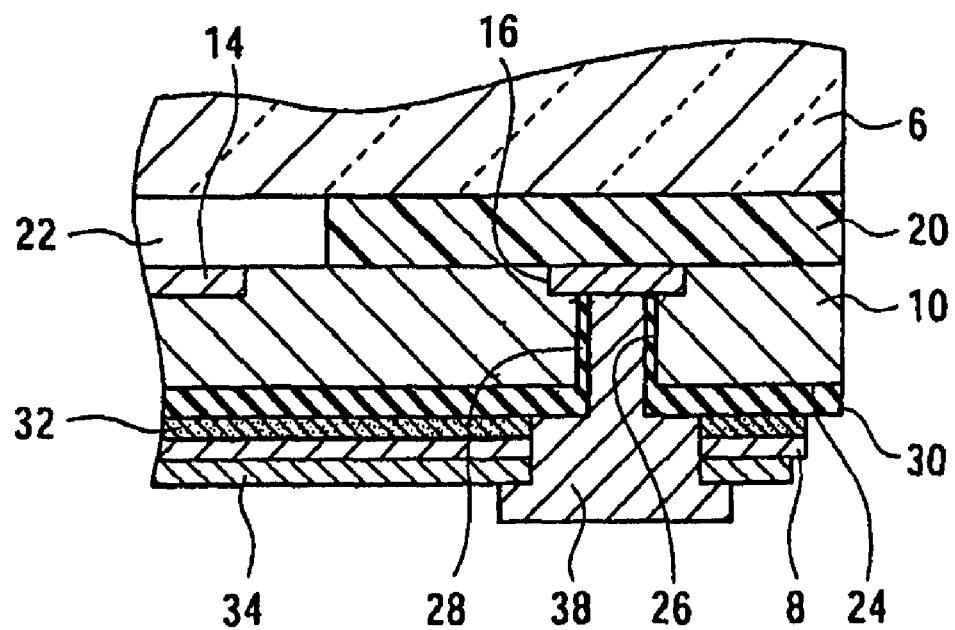

Prior Art

SOLID IMAGE-PICKUP DEVICE WITH FLEXIBLE CIRCUIT SUBSTRATE

The subject matter of application Serial No. 11/303,297 is incorporated herein by reference. The present application is a continuation of U.S. Ser. No. 11/303,297 filed Dec. 16, 2005, now U.S. Pat. No. 7,187,051 which is a continuation of U. S. Ser. No. 10/263,122, filed on Oct. 2, 2002, now U.S. Pat. No. 7,045,870 which claims priority to Japanese Patent Application No. JP2001-308512 filed Oct. 4, 2001, all of which are incorporated herein by reference.

BACKGROUND OF THE INVENTION

1. Field of the Invention

The present invention relates to a solid image-pickup device and a method for manufacturing the solid image-pickup device. In particular, this invention relates to a technique for manufacturing an improved solid image-pickup device which is compact in size and low in production cost.

2. Description of the Related Art

FIG. 6 is a cross sectional side view showing a conventional solid image-pickup device.

As shown in FIG. 6, the conventional solid image-pickup device 102 includes a package 104 having an internal recess portion 106. A solid image-pickup element 108 formed by disposing light sensors and the like on a semiconductor substrate is received into the internal recess portion 106, with its light receiving surface facing upward. Along the edge portions of the surface of the solid image-pickup element, there are arranged a plurality of bonding pads 112. These bonding pads 112 are connected through bonding wires 116 with terminal electrodes 114 of the package 104. Each of the terminal electrodes 114 is connected with one end of one of external terminals 118 inserted through the package 104, while the other end of such one external terminal 118 is allowed to produce to the outside of the package 104 from the backside thereof.

Above the solid image-pickup element 108 there is disposed a transparent plate 120 which is provided to protect the solid image-pickup element 108 in order to ensure its reliability. Specifically, the transparent plate 120 is adhesively fixed on the package 104 above the recess portion 106, so as to ensure an airtight state within the recess portion 106 of the package 104.

However, with regard to the above-described conventional solid image-pickup device, since the solid image-pickup element 108 (semiconductor substrate) has to be received into each package 104, an entire size of the solid image-pickup device has to be larger than the solid image-pickup element 108. Moreover, since the external terminals 118 are protruding from the backside of the package 104, it is impossible to avoid an increase in the thickness of the package 104 containing the external terminals 118.

Moreover, with regard to the above-described conventional arrangement, since the solid image-pickup element 108 has to be received into the package 104 in order to complete a packaging process, it is necessary to perform an operation in which the bonding pads 112 of the solid image-pickup elements 108 have to be connected with the terminal electrodes 114 of the package 104 by way of the bonding wires 116. As a result, it is difficult to ensure a high production efficiency as well as a low production cost.

On the other hand, it is extremely important for a digital still camera, a video camera or a PDA (Personal Digital Assistants) apparatus to be made compact in size and low in cost. For this reason, the solid image-pickup device 102 which serves as a main component to be incorporated into each of these apparatus, is usually strongly required to be made compact in size and low in production cost.

SUMMARY OF THE INVENTION

The present invention has been accomplished in order to solve the aforementioned problem, and it is an object of the invention to provide an improved solid image-pickup device which is compact in size and low in production cost, as well as to provide a method for manufacturing such an improved solid image-pickup device.

In order to achieve the above object of the present invention, there is provided an improved solid image-pickup device including a semiconductor substrate having a plurality of light sensors and a plurality of bonding-pads on the surface, a transparent plate fixed on the surface of the semiconductor substrate, the surface of the transparent plate surface facing the light sensors; through holes extending from the lower surfaces of the bonding pads to the back surface of the semiconductor substrate; a first insulating film covering the inner surfaces of the through holes; a second insulating film surrounding at least the openings of the through holes at the back surface of the semiconductor substrate; and an electrically conductive material supplied in the through holes, electrically connected with the lower surfaces of the bonding pads, and exposed from the openings of the through holes.

Further, according to the present invention, there is also provided a method of manufacturing solid image-pickup devices including a semiconductor substrate having a plurality of light sensors and a plurality of bonding pads on the surface, the method comprising the steps of: bonding a transparent plate to a surface of a semiconductor wafer, the surface including a plurality of semiconductor substrate portions for a plurality of solid image-pickup devices, the transparent plate having a plate surface facing the surface of the semiconductor wafer and having substantially the same size as that of the semiconductor wafer; grinding the back surface of the semiconductor wafer bonded with the transparent plate, to reduce the thickness of the semiconductor wafer; forming through holes extending from the back surface of the semiconductor wafer to the lower surfaces of the bonding pads; forming a first insulating film on the inner surface of each of the through holes; forming a second insulating film on the back surface of the semiconductor wafer so as to surround at least the openings of the through holes; and cutting the semiconductor wafer together with the transparent plate to form a plurality of solid image-pickup devices.

BRIEF DESCRIPTION OF THE DRAWINGS

FIG. 1A is a cross sectional side view showing a solid image-pickup device formed according to one embodiment of the present invention.

FIG. 1B is an enlarged cross sectional view showing portion IB of FIG. 1A.

DESCRIPTION OF THE PREFERRED EMBODIMENTS

An embodiment of the present invention will be described in the following with reference to the accompanying drawings.

Figure 2:
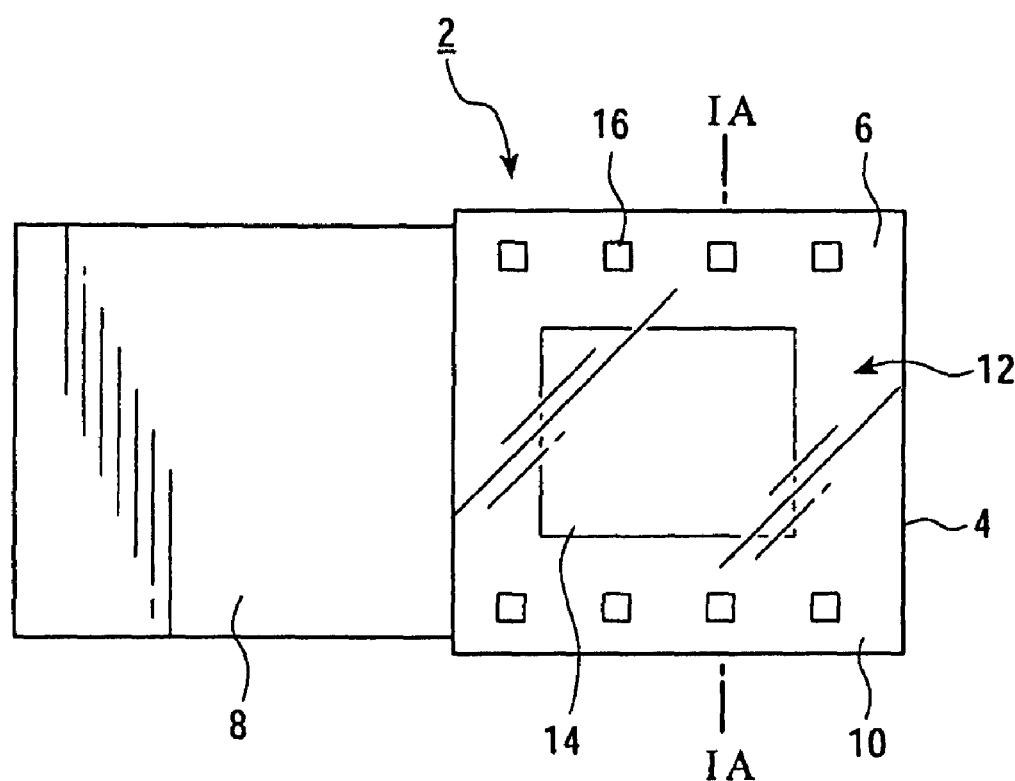
FIG. 2 is a plan view showing the solid image-pickup device formed according to the embodiment of the invention.
Figure 3:
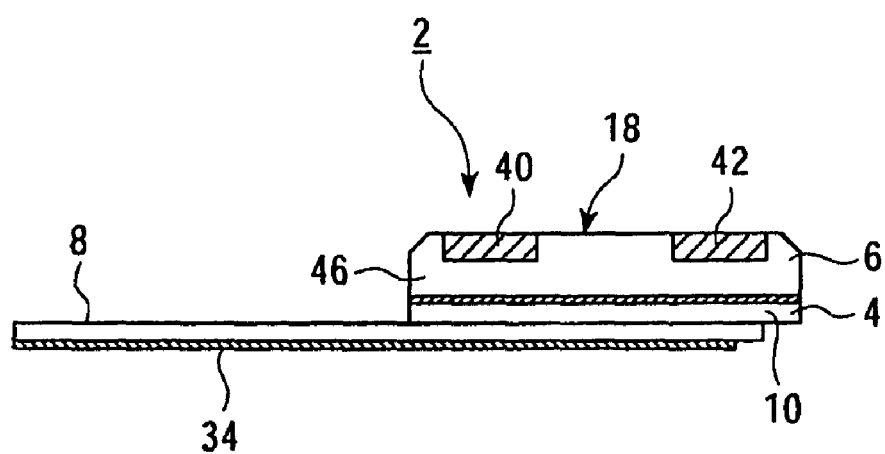
FIG. 3 is a side view showing the solid image-pickup device, when viewed from a position under the drawing in FIG. 2.
Figure 4:
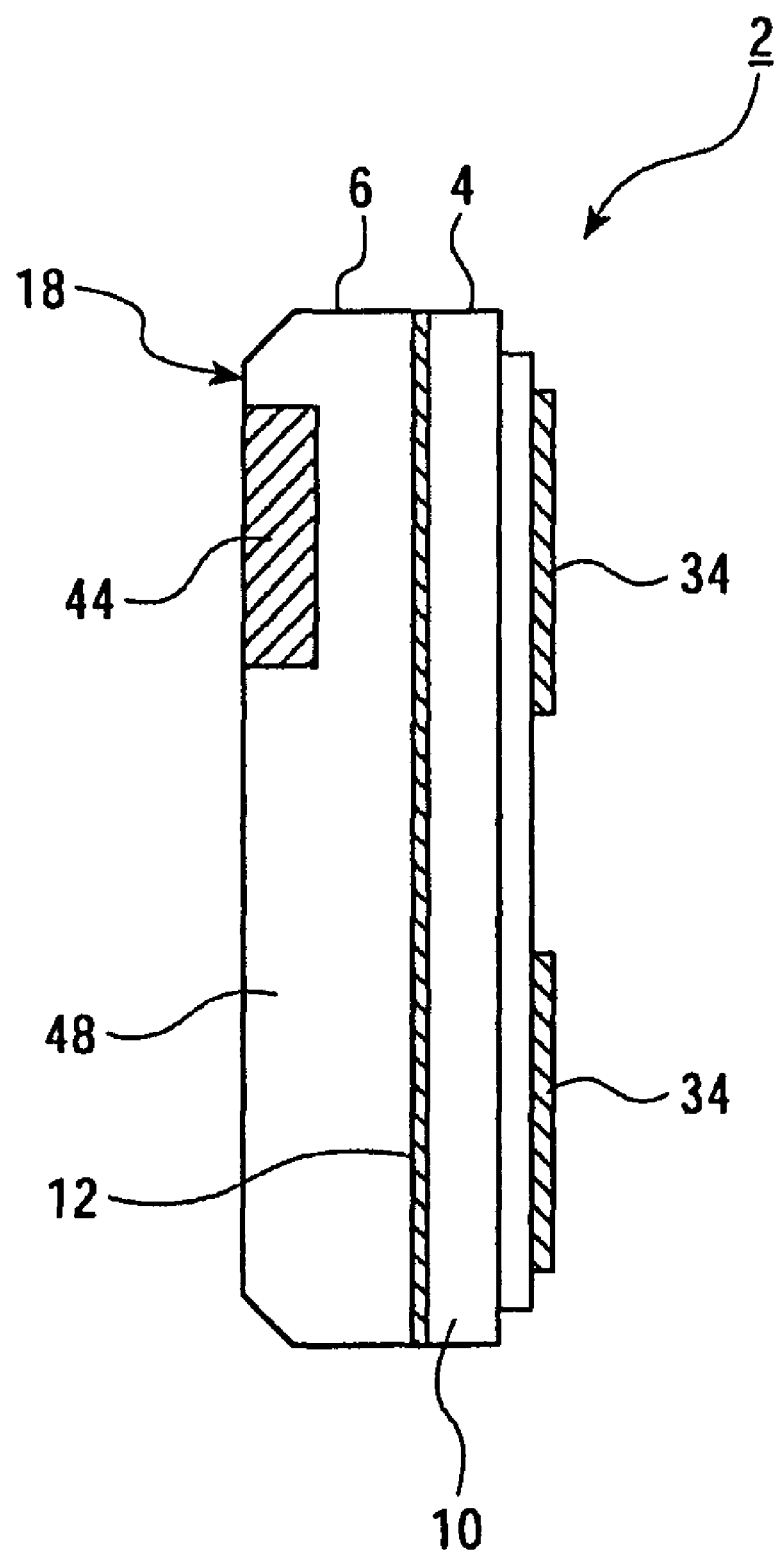
FIG. 4 is a side view showing the solid image-pickup device, when viewed from a position on the right side of the drawing in FIG. 2.
Figure 5:
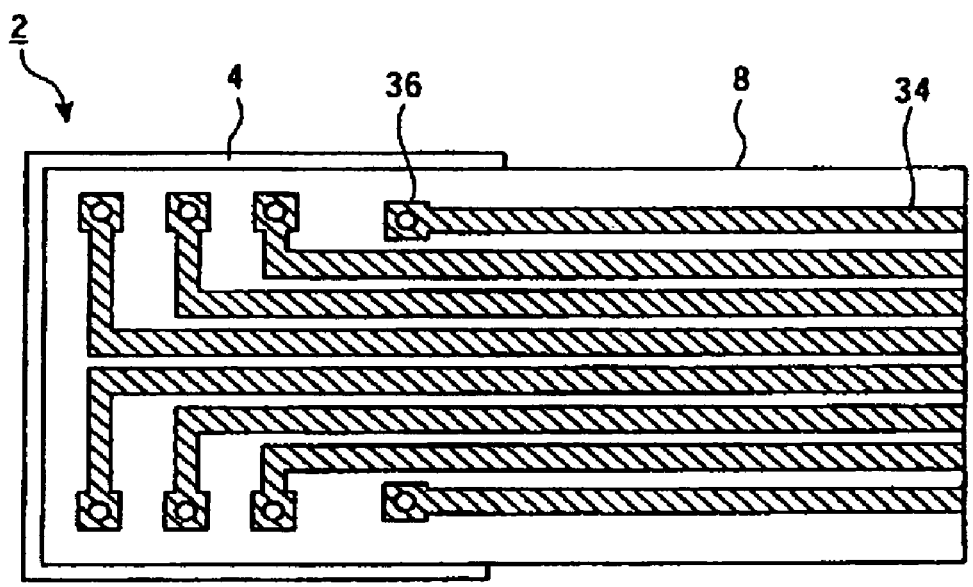
FIG. 5 is a back view of the solid image-pickup device formed according to the embodiment of the present invention.
Figure 6:
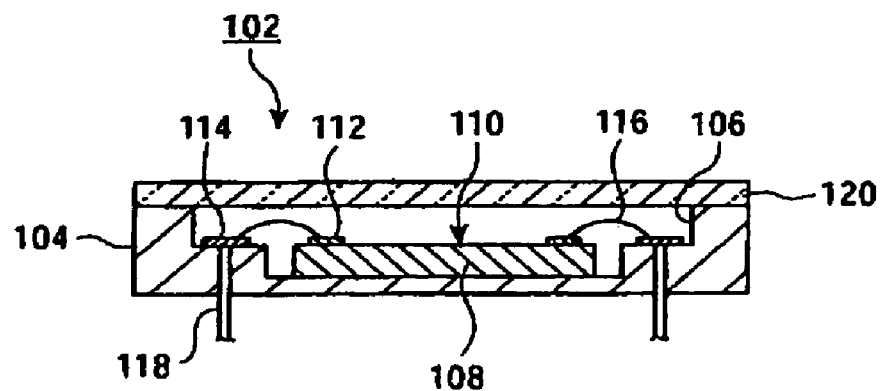
FIG. 6 is a side view showing a conventional solid image-pickup device.

FIG. 1A is a cross sectional side view showing a solid image-pickup device formed according to one embodiment of the present invention. FIG. 1B is an enlarged cross sectional view showing portion IB of FIG. 1A. FIG. 2 is a plan view showing the solid image-pickup device formed according to the embodiment of the invention. FIG. 3 is a side view showing the solid image-pickup device, when viewed from a position under the drawing in FIG. 2. FIG. 4 is a side view showing the solid image-pickup device, when viewed from a position on the right side of the drawing in FIG. 2. FIG. 5 is a back view of the solid image-pickup device formed according to the embodiment of the present invention. Specifically, FIG. 1A and FIG. 1B are cross sectional views taken along IA-IA line in FIG. 2.

As shown in FIGS. 2 through 5, the solid image-pickup device 2 formed according to the present embodiment comprises a solid image-pickup element 4, a transparent plate 6 and a flexible circuit substrate 8.

The solid image-pickup element 4 includes a plurality of light sensors arranged in an image-pickup area 14 which is rectangular in shape and located in the central area on the surface 12 of a semiconductor substrate 10, also includes a plurality of bonding pads 16 along the edge portions of the surface of the semiconductor substrate. The semiconductor substrate 10 has a thickness of 100 µm or less, while the transparent plate 6 may be formed by a quartz glass. Both the solid image-pickup element 4 and the transparent plate 6 are rectangular in shape when viewed as plan views, and have the same shape as well as the same size. The transparent plate 6 is fixed on the surface 12 of the semiconductor substrate 10, in a manner such that the two members are caused to face each other and be coincident in their positions.

Specifically, the ridge line portions 18 (located opposite to the semiconductor substrate 10) of the transparent plate 6 are chamfered, as shown in FIGS. 3 and 4.

As shown in FIG. 1, the semiconductor substrate 10 and the transparent plate 6 are bonded to each other by virtue of a sealing agent 20. Here, the sealing agent 20 is applied to the edge portions of the semiconductor substrate 10 and the transparent plate 6, extending around the entire image-pickup area 14. In this way, corresponding to the central portions of both the semiconductor substrate 10 and the transparent plate 6, a clearance having a thickness corresponding to the thickness of the sealing agent 20 is formed between the surface 12 of the semiconductor substrate 10 and the lower surface of the transparent plate 6, forming an internal space 22 which is in an airtight state by virtue of the sealing agent.

Further, the semiconductor substrate 10 is formed with a plurality of through holes 26, located in positions corresponding to the bonding pads 16, and extending from the lower surfaces of the bonding pads 16 to the back surface 24 of the semiconductor substrate 10. Specifically, the diameter of each of the through holes 26 is smaller than that of each of the bonding pads 16, and the internal surface of each through hole 26 is coated with an insulating film 28. Moreover, an entire area of the back surface 24 of the semiconductor substrate 10 (not including the openings of the through holes 26) is coated with an insulating film 30 having a thickness of several microns. In practice, both the insulating film 28 and the insulating film 30 may be formed by a polyimide resin.

A flexible circuit substrate 8 is bonded through an adhesive agent 32 to the back surface 24 of the semiconductor substrate 10, in a manner such that the plate surface of the circuit substrate 8 can face the back surface 24 of the semiconductor substrate 10. Further, a copper wire 34 serving as an external lead wire for the solid image-pickup device 2 is provided on the surface of the flexible circuit substrate 8. In this manner, the flexible circuit substrate 8 is bonded to the semiconductor substrate 10, with the copper wire 34 being located on the outside of the device. Further, on the flexible circuit substrate 8 and corresponding to the through holes 26, there are formed a plurality of lands 36 (see FIG. 5) in connection with the copper wire 34. Specifically, each of the lands 36 is formed with a through hole having a diameter larger than each through hole 26, and openings having substantially the same diameters are formed in the corresponding positions through the above adhesive agent layer 32.

Then, an amount of electrically conductive material 38 which will protrude to the lands 36 is used to fill the through holes 26 of the semiconductor substrate 10 and the through holes of the flexible circuit substrate 8. In this manner, by way of such an electrically conductive material 38, the bonding pads 16 of the semiconductor substrate 10 as well as the lands 36 of the flexible circuit substrate 8 can be electrically connected with the copper wire 34. Here, in more detail, the electrically conductive material 38 may be formed by hardening an electrically conductive paste.

In fact, the flexible circuit substrate 8 is formed such that its longitudinal direction can be arranged in the lateral direction of the image-pickup device, and that one end thereof is extending to one side of the semiconductor substrate 10.

In this way, since the solid image-pickup device 2 of the present embodiment is constructed in a manner such that the transparent plate 6 is disposed to cover the surface 12 of the semiconductor substrate 10 on which light sensors are arranged, such an arrangement is different from a conventional image-pickup device in which the semiconductor substrate is received into a package. Namely, when viewed as a plan view, the device of the present embodiment has only a size which is exactly the same as the semiconductor substrate 10. Further, the thickness of the device includes only the thicknesses of the transparent plate 6 and the semiconductor substrate 10. For this reason, it is possible to greatly reduce the size of the solid image-pickup device 2, especially the thickness thereof.

Further, since the flexible circuit substrate 8 is disposed to cover the back surface 24 of the solid image-pickup device 2, and since the bonding pads 16 on the semiconductor substrate 10 are connected with the wire on the flexible circuit substrate 8 by virtue of the electrically conductive material 38 received in the through holes 26, it is possible to obtain an improved thickness-reduced image-pickup device including an external circuit (flexible circuit substrate 8).

Usually, in an apparatus such as digital still camera containing the solid image-pickup device 2, since an optical lens is disposed in front of the solid image-pickup device 2, the apparatus as a whole is likely to become thick in its thickness. For this reason, the fact that it has become possible to produce a thickness-reduced solid image-pickup device 2 is extremely favourable in producing an improved optical apparatus which is thin in its thickness.

Besides, according to the present embodiment of the invention, since the ridge line portions 18 of the transparent plate 6 are chamfered, when the solid image-pickup device 2 is installed into an optical apparatus and when the transparent plate 6 accidentally bumps against a lens block or the like within the optical apparatus. it is possible to prevent the transparent plate 6 from getting broken off.

Further, when the solid image-pickup device 2 is installed into a digital still camera or the like, if (for example) reference surfaces 40, 42 and 44 set on the side surface of the transparent plate 6 are used as the working reference, it is possible to incorporate the solid image-pickup device into the camera in an accurate positioning process with a high precision. Moreover, as shown in FIG. 3, the reference surfaces 40 and 42 are set on the same side surface 46 of the transparent plate, but mutually separated from each other at a predetermined interval. However, the reference surface 44, as shown in FIG. 4, is set on the other side surface 48 of the transparent plate, perpendicular to the side surface 46. In this way, even if the side surfaces of the transparent plate 6 are used as references, since there are no positional dislocations between the side surfaces of the transparent plate 6 and the side surface of the semiconductor substrate 10, it is possible to carry out the positioning of the semiconductor substrate 10 with a high precision. Further, a precision in positional relation between the side surface of the semiconductor substrate 10 and the image-pickup area 14 can be determined in accordance with a cutting precision when the wafer is cut and individual solid image-pickup devices 2 are obtained. In fact, such a precision can be made at 10 µm or less. Accordingly, it is possible to carry out the positioning of the image-pickup area 14 with respect to an optical apparatus, with only an extremely small error of 10 µm or less. Moreover, since it is possible to easily perform the positioning with a high precision, it is allowed to shorten a working time necessary for installing the solid image-pickup device 2 into an optical apparatus.

The solid image-pickup device 2 having the above-described structure can be manufactured at an extremely low cost, with the use of a method which will be explained in detail below.

One example of a method for manufacturing the solid image-pickup device 2 according to the present invention will be described with reference to FIGS. 1 through 5.

At first, a transparent plate having the same size as that of a semiconductor wafer is bonded (by means of the sealing agent 20, i.e., an adhesive agent) to the surface of the semiconductor wafer on which semiconductor substrate portions for a plurality of solid image-pickup devices have been formed. During the bonding process, the sealing agent 20 is applied to either the semiconductor wafer or the transparent plate, corresponding to the respective solid image-pickup devices to be formed on the semiconductor wafer, in a manner such that each image-pickup area 14 is surrounded by the sealing agent, thereby bonding together the semiconductor wafer and transparent plate. Then, the sealing agent 20 is hardened by heating or by irradiating with an ultraviolet light.

Subsequently, the back surface of the semiconductor wafer, on which the transparent plate has been bonded, is ground so as to reduce the thickness of the semiconductor wafer to 100 µm or less.

Afterwards, the trough holes 26 are formed extending from the back surface of the semiconductor wafer to the lower surfaces of the bonding pads 16. In forming these through holes, it is allowed to employ one of several commonly used processes, such as a process using a laser, a process using a photolithography technique or the like.

Then, the inner surface of each through hole 26 is coated with an insulating film 28 formed by a polyamide resin, while the back surface 24 (not including the openings of the through holes 26) of the semiconductor wafer is coated with an insulating film 30. Here, the insulating film 30 may be a polyimide tape.

Subsequently, the semiconductor wafer along with the transparent plate are cut into several smaller portions corresponding to the respective solid image-pickup devices, thereby individually obtaining solid image-pickup devices. At this time, if several grooves each having a V-shaped cross section are formed in advance on the surface of the transparent plate before the cutting process is carried out, and if the semiconductor wafer together with the transparent plate are cut along these grooves, it is possible to obtain a plurality of solid image-pickup devices each having such a transparent plate that its ridge line portions have been chamfered.

Afterwards, a flexible circuit substrate 8 is bonded to the back surface 24 of each small semiconductor wafer, while the through holes 26 are filled with an electrically conductive paste which is then heated so as to be hardened, thereby rendering the bonding pads 16 of the semiconductor substrate 10 to be electrically connected with the copper wire 34 of the flexible circuit substrate 8.

With the use of the manufacturing method described above, it is not necessary to perform a conventional operation in which semiconductor substrates are individually received into the respective packages to form the respective solid image-pickup devices, while the packages and the semiconductor substrates are connected with each other through the bonding wires. Moreover, since the transparent plate can be bonded to the semiconductor wafer and subsequent processes can be carried out dealing with only the integrally bonded body, it is possible to produce a large number of solid image-pickup devices during each one operation, thereby making it possible to greatly reduce the production cost.

However, the method of the present invention for manufacturing the solid image-pickup element and the solid image-pickup device should not be limited to the above-described example. In fact, it is also possible to carry out one of some other methods without departing from the scope prescribed by the spirit of the present invention.

For example, although the above description shows that each flexible circuit substrate 8 is bonded to the back surface 24 of each semiconductor substrate 10, it is also allowed not to use the flexible circuit substrate 8. Namely, it is effective that after the back surface of the semiconductor substrate 10 is subjected to an insulating treatment, bumps or the like are formed on the openings of the through holes 26.

Figure 7A:
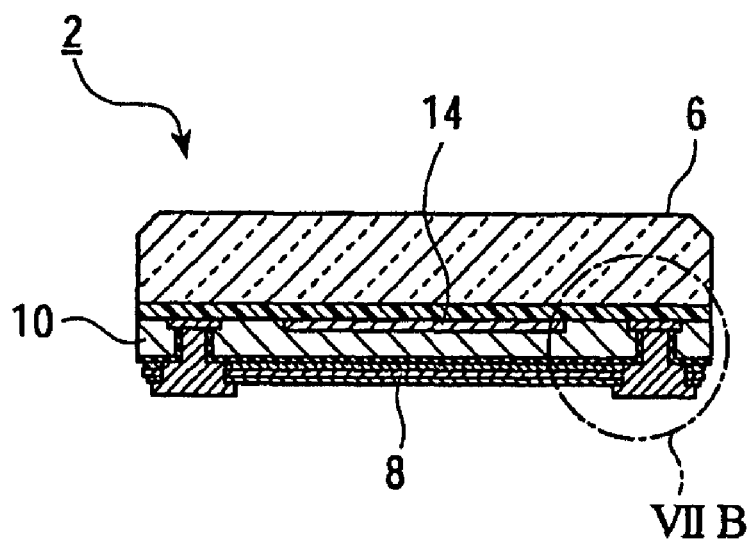
FIG. 7A is a cross sectional side view showing a solid image-pickup device formed according to another embodiment of the present invention.
Figure 7B:
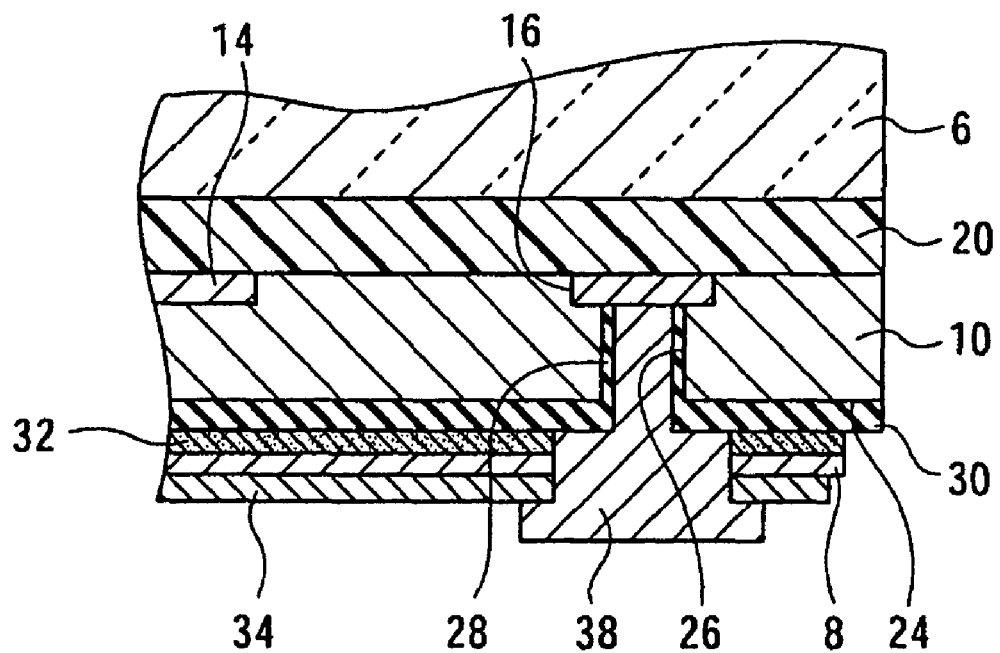
FIG. 7B is an enlarged cross sectional view showing portion VIIB of FIG. 7A.

Further, although the present embodiment shown in FIG. 1 indicates that the sealing agent is applied to the edge portions of the semiconductor substrate and the transparent plate in a manner such that the applied sealing agent extends around the entire image-pickup area, it is also possible to employ a method shown in FIG. 7 which indicates that a light-transmissible material may be used in the sealing agent, and such a sealing agent may be interposed between the entire surface of the semiconductor substrate and the transparent plate. In this way, especially in a process for manufacturing an image-pickup device which is required to be compact in size, it is not necessary to control the forming position of the sealing agent with respect to an image-pickup area, and in a process of bonding together the semiconductor wafer and the transparent plate, it is allowed to apply the sealing agent to the entire surface of the semiconductor wafer. For this reason, even if it is difficult to control the forming position of the sealing agent as shown in the structure of FIG. 1, it is still possible to manufacture the image-pickup device which is compact in size.

As described in the above, the solid image-pickup device of the present invention and the solid image-pickup device manufactured using the method of the present invention, are constructed in a manner such that the transparent plate is disposed to cover the surface of the semiconductor substrate on which light sensors have been arranged. Therefore, such an arrangement is different from a conventional structure in which a semiconductor substrate is received into a corresponding package. Namely, when viewed as a plan view, the device of the present invention has only a size which is exactly the same as the semiconductor substrate. Further, the thickness of the device includes the thicknesses of the transparent plate and the semiconductor substrate. For this reason, it is possible to greatly reduce the size of a solid image-pickup device, especially the thickness thereof.

Further, since the flexible circuit substrate is disposed to cover the back surface of the solid image-pickup device, and since the bonding pads on the semiconductor substrate are connected with the wire on the flexible circuit substrate by virtue of the electrically conductive material received in the through holes, it is possible to obtain an improved thickness-reduced image-pickup device including an external circuit.

As a result, it is not necessary to perform a conventional operation in which semiconductor substrates are individually received into the packages corresponding to the respective solid image-pickup devices, while the packages and the semiconductor substrates are connected with each other through the bonding wires. Moreover, since the transparent plate can be bonded to the semiconductor wafer, and subsequent processes can be carried out with respect to the integrally bonded body, it is possible to produce a large number of solid image-pickup devices during each one operation, thereby making it possible to greatly reduce the production cost.

What is claimed is:

1. A solid image-pickup device comprising:
   a semiconductor device having a plurality of light sensors located at a first side;
   through holes extending from a second side of said semiconductor device to the first side providing electrical communication between the light sensors and electrical connections at the second side of said semiconductor device;
   a flexible circuit substrate disposed adjacent to the second side of said semiconductor device;
   an insulating film covering inner side surfaces of the through holes; and
   an electrically conductive material fully filled in the through holes, wherein the electrically conductive material is in contact with lower surfaces of bonding pads located at the first side providing electrical communication to the light sensors and further wherein the electrically conductive material extends through holes in conductive pads at a side of said semiconductor device that is opposite the side at which the bonding pads are located, thereby electrically connecting the bonding pads and conductive pads, and wherein said flexible circuit substrate has the conductive pads formed thereon and said flexible circuit substrate has holes at locations corresponding to the through holes, the holes in the said flexible circuit substrate extending through the conductive pads and having a substantially larger diameter than the through holes, a portion of the electrically conductive material being over-filled from the openings of the through holes at the second side of said semiconductor device, the electrically conductive material being electrically connected with said flexible circuit substrate.

2. The solid image-pickup device according to claim 1, wherein a transparent plate is fixed over a surface of said semiconductor device and when viewed as a plan view has substantially the same shape and substantially the same size as said semiconductor device.

3. The solid image-pickup device according to claim 1, wherein a transparent plate is fixed over a surface of said semiconductor device with a sealing agent disposed between the transparent plate and said semiconductor device, said sealing agent is disposed exclusively along edge portions of the surface of said semiconductor device and surrounding at least all the light sensors, with an internal void surrounded by the sealing agent being sealed airtight.

4. The solid image-pickup device according to claim 1, wherein a transparent plate is fixed over a surface of said semiconductor device with a sealing agent disposed between the transparent plate and the entire surface of said semiconductor device.

5. The solid image-pickup device according to claim 1, wherein the electrically conductive material is provided inside the through holes adjacent the insulating material.

6. The solid image-pickup device according to claim 1, further wherein said flexible circuit substrate is copper-clad.

7. A solid image-pickup device comprising: a semiconductor device having a plurality of light sensors located at a first side;
   a plurality of bonding pads located at the first side adjacent an imaging area at which the plurality of light sensors are located;
   through holes extending from a second side of said semiconductor device to the first side providing electrical communication between the light sensors and electrical connections at the second side of said semiconductor device;
   a flexible circuit substrate disposed adjacent to the second side of said semiconductor device;
   a sealing agent formed over the bonding pads and surrounding the imaging area without extending over the light sensors, wherein an electrically conductive material is provided in the through holes and being in contact with lower surfaces of the bonding pads located at the first side providing electrical communication to the light sensors and further wherein the electrically conductive material extends through holes in conductive pads at the second side of said semiconductor device, thereby electrically connecting the bonding pads and conductive pads, and wherein said flexible circuit substrate has the conductive pads formed thereon and said flexible circuit substrate has holes at locations corresponding to the through holes, the holes in said flexible circuit substrate extending through the conductive pads and having a substantially larger diameter than the through holes, a portion of the electrically conductive material being over-filled from the openings of the through holes at the second side of said semiconductor device, the electrically conductive material being electrically connected with said flexible circuit substrate.

8. The solid image-pickup device according to claim 7, wherein a transparent plate is fixed over a surface of said semiconductor device above the imaging area and when viewed as a plan view has substantially the same shape and substantially the same size as said semiconductor device.

9. The solid image-pickup device according to claim 7, wherein a transparent plate is fixed over a surface of said semiconductor device with the sealing agent disposed between the transparent plate and said semiconductor device, said sealing agent is disposed exclusively along edge portions of the surface of said semiconductor device and over the bonding pads and surrounding at least all the light sensors, with an internal void surrounded by the sealing agent being sealed airtight.

10. The solid image-pickup device according to claim 7, wherein a transparent plate is fixed over a surface of said semiconductor device with a sealing agent disposed between the transparent plate and the entire surface of said semiconductor device.

11. The solid image-pickup device according to claim 7, wherein the electrically conductive material is provided inside the through holes extending from the bonding pads to provide electrical communication with the second side of said semiconductor device.

12. The solid image-pickup device according to claim 11, further wherein said flexible circuit substrate is copper-clad.

* * * * *